(12) United States Patent
Ma et al.

(10) Patent No.: US 6,945,318 B2
(45) Date of Patent: Sep. 20, 2005

(54) HEAT-DISSIPATING DEVICE

(75) Inventors: Mou-Ming Ma, Sindian (TW); Hsiang-Chieh Tseng, Taipei (TW); Tung-Shan Lee, Lujhou (TW); Yi-Song Liu, Taipei (TW); Chia-Min Chou, Sanchong (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/763,196

(22) Filed: Jan. 26, 2004

(65) Prior Publication Data

US 2005/0161199 A1    Jul. 28, 2005

(51) Int. Cl.[7] .............................................. F28D 15/02
(52) U.S. Cl. ............................... 165/104.33; 165/80.3
(58) Field of Search .............................. 165/121, 80.3, 165/185, 104.33; 361/697, 704, 710; 174/16.3; 257/719, 722

(56) References Cited

U.S. PATENT DOCUMENTS

| | | | |
|---|---|---|---|
| 3,279,209 A | * | 10/1966 | Nikolaus ...................... 62/426 |
| 5,583,746 A | * | 12/1996 | Wang ......................... 361/697 |
| 6,125,920 A | * | 10/2000 | Herbert ...................... 165/80.3 |
| 6,193,205 B1 | * | 2/2001 | Wang ......................... 248/510 |
| 6,386,274 B1 | * | 5/2002 | Wang et al. ................ 165/80.3 |
| 6,625,021 B1 | * | 9/2003 | Lofland et al. ............. 361/697 |
| 6,659,169 B1 | * | 12/2003 | Lopatinsky et al. ........ 165/80.3 |
| 6,796,373 B1 | * | 9/2004 | Li ........................... 165/104.21 |
| 6,892,800 B2 | * | 5/2005 | Mok ...................... 165/104.33 |
| 2003/0137047 A1 | * | 7/2003 | Lopatinsky et al. ......... 257/722 |

* cited by examiner

Primary Examiner—Teresa J. Walberg
(74) Attorney, Agent, or Firm—Rosenberg, Klein & Lee (57) ABSTRACT

A heat-dissipating device is provided. The heat-dissipating device is capable of cooperating a cross-flow type fan, mainly comprising a heat-conductive base plate attached with at least one heat-conductive pipe, and fixedly provided with a plurality of fins on the heat-conductive pipe. An air-outlet gap is naturally formed between any two of the adjacent fins, and an accommodating opening is disposed at an identical location on each of said fins. Within the accommodating opening, a cross-flow type fan is further presented. When fan blades of the cross-flow type fan rotating, an airflow thus generated is allowed for uniformly contacting with each of said fins and discharged through said air-outlet gaps. Thereby, not only the significantly raised effect of heat-dissipation of the heat-conductive base plate, but also the effectively reduced working noise due to a parallel path of the airflow with respect to the fins may be obtained.

16 Claims, 7 Drawing Sheets

HEAT-DISSIPATING DEVICE

FIELD OF THE INVENTION

The present invention is related to a heat-dissipating device, particularly to a heat-dissipating device capable of cooperating with a cross-flow type fan, by which the significantly raised effect of heat-dissipation of a heat-conductive base plate.

BACKGROUND

Accordingly, as the semi-conductor process progresses increasingly, the volume of the chip and processor used in current electronic apparatuses or computer systems, such as central processing units (CPUs) and another electronic devices in the computer systems, may become smaller and smaller, whereas the working performance and the computation speed is relatively doubled. Due to the accelerated data processing speed, the accompanying working temperature may be just raised without dropping. Therefore, for the purpose of avoiding the degraded computation efficiency and even the damage resulted from the super-high working temperature, the heat-dissipating device is required for the CPUs and another electronic devices in order to effectively lower the high working temperature of the latter.

Figure 1:
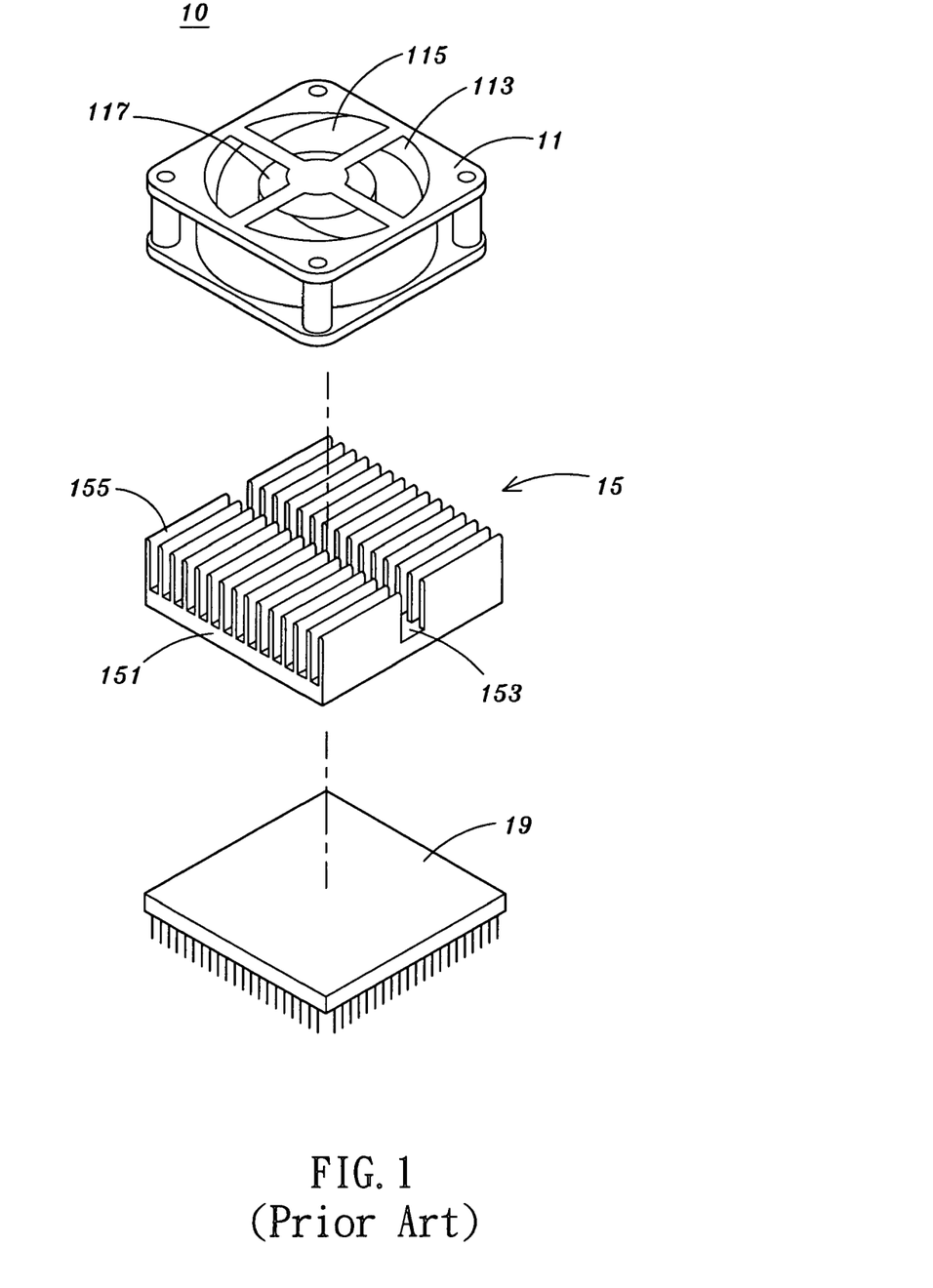
FIG. 1 is a structural disassembled diagram of a conventional heat-dissipating device.

Generally, a traditional heat-dissipating device 10, as shown in FIG. 1, mainly comprises a radiator 15 and a fan 11, wherein the radiator 15 comprises a heat-conductive base plate 151 provided with a plurality of fins 155 protruding therefrom, and an air outlet 153 may be formed naturally between each of the fins 155. Further, the heat-conductive base plate 151 is fixedly provided on the top surface of a chip, central processing unit (CPU), or electronic device 19, such that the high working temperature is generated as the electronic device 19 operates, may be transmitted to the heat-conductive base plate 151 and each of the fins 155 by means of heat conduction. Further, the fan 11 is disposed at the top side of the fins 155. When a motor 117 of this fan operates and controls the rotation of fan blades 115, cooling air may be introduced from an air outlet 113 and then blown toward the fins 155 for removing the high working temperature, having been conducted to the fins 155, to the exterior. Thereby, the high working temperature generated by the electronic device 19 may be reduced.

Figure 2A:
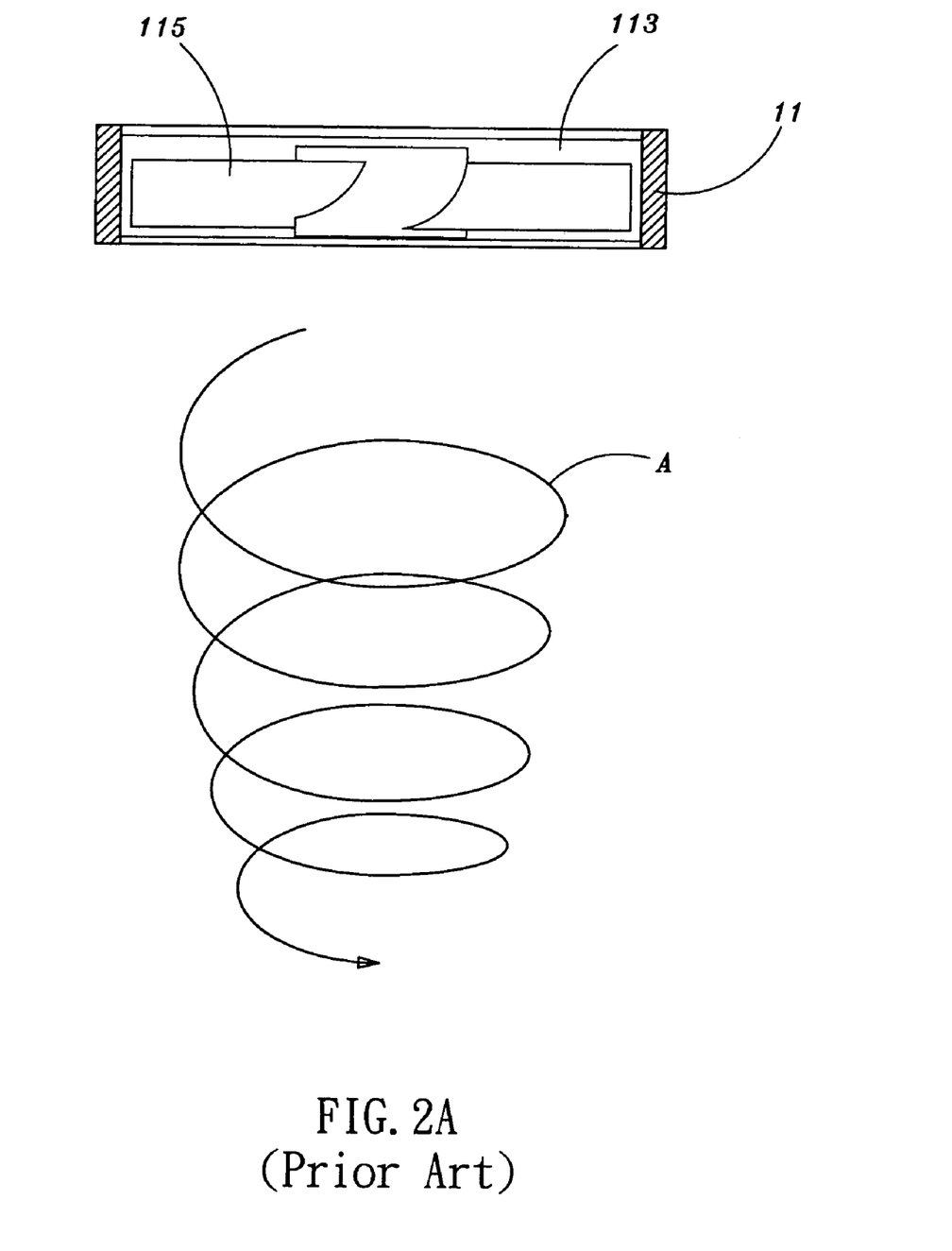
FIG. 2A is a diagram of an airflow path generated in the conventional heat-dissipating device when a fan rotates.
Figure 2B:
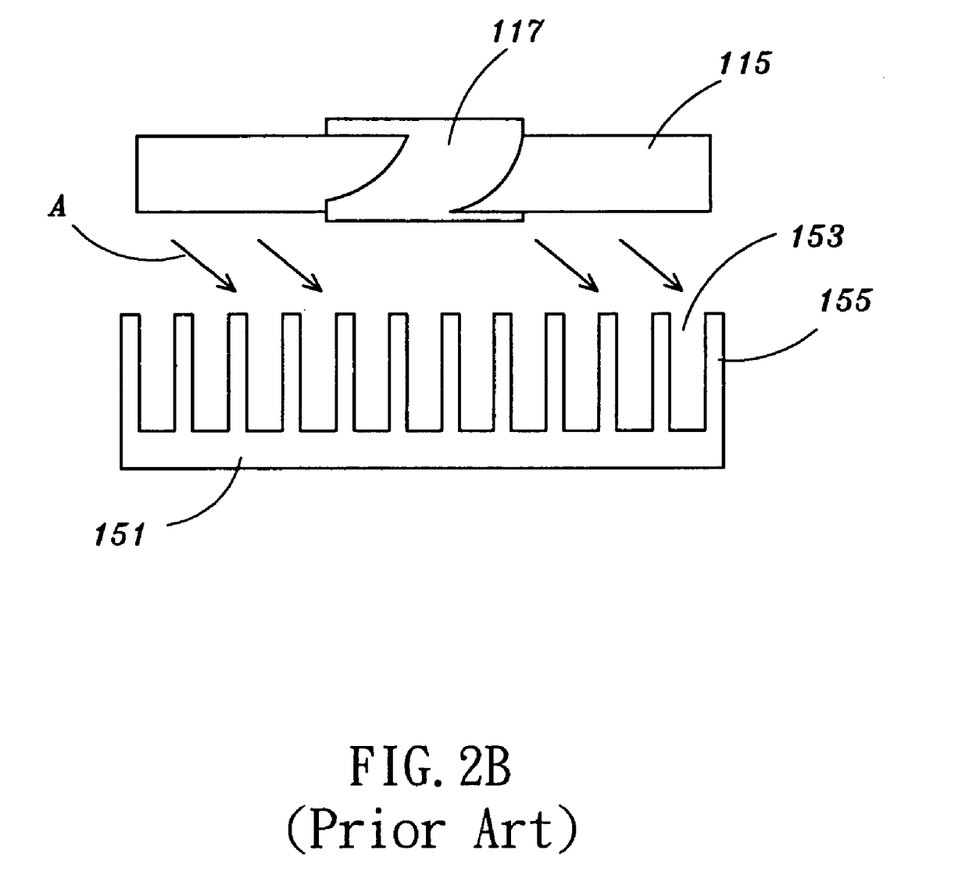
FIG. 2B is a structural side view of the conventional heat-dissipating device when the fan rotates.

Referring to FIGS. 2A and 2B, there are shown a diagram and a structural side view of the conventional heat-dissipating device, respectively. A cooling airflow A, generated by the rotation of the fan blades 115, is presented as a spiral mode, due to the fact that an axial-flow type fan 11 is commonly used as that fan in the conventional heat-dissipating device 10. Inevitably, this spiral airflow A may be collided with the fins 155 when the former flows toward the fins 155. As such, not only degraded performance resulted from a hindered or degraded airflow, but also annoying working noise may emerge.

Moreover, the effect of heat-dissipation at the center of the heat-conductive base plate 151 is relatively poor and thus unattainable to its best performance of heat-dissipation, owing to the motor 117, which must be disposed at the center of the fan 11, and the formed spiral airflow. Further, it is impossible for the cooling airflow A to arrive at the bottom side of the fins 155 and the heat-conductive base plate 151, because the fan 11 is disposed at the top side of the fins 155. This may also significantly degrade the best performance of heat-dissipation.

For this reason, none of the industry is reluctant to invest vigor and cost in studying the improvement for the conventional heat-dissipating device, for instance, the new technologies disclosed in Taiwan Patent Publication No. 491519, entitled "Improvement For Fin Structure (III)", and in Taiwan Patent Publication No. 500302, entitled "Fin Structure", to overcome imperfections in present technology. However, for the disclosed technology in the aforementioned patents, there still exist following disadvantages:

1. It is still hard for the cooling airflow to arrive at the remote fins or the heat-conductive base plate, due to the fact that the fan is disposed at either the top end or the side end of the fins, so as to significantly degrade the best heat-conductive performance.
2. The spiral airflow may still hit against the fins because the axial-flow type fan is used, which results in not only degrading heat-conductive performance, but also generating annoying working noise.
3. The center of the axial-flow type fan is still not supplied with the cooling airflow, leading to degrading the best performance of heat-dissipation.

SUMMARY OF THE INVENTION

Accordingly, how to design a novel heat-dissipating device allowed for uniformly blowing the cooling airflow toward each of the fins and decreasing the probability of collision between the cooling airflow and the fins in order to achieve the effectively raised heat-dissipating performance and the reduced working noise is the key point of the present invention.

It is a primary object of the present invention to provide a heat-dissipating device capable of eliminating the imperfection in technology with which the conventional heat-dissipating device is confronted.

It is a secondary object of the present invention to provide a heat-dissipating device provided with a cross-flow type fan disposed within an accommodating opening formed by fins such that a cooling airflow generated by the cross-flow fan may be uniformly blow toward everywhere of each of the fins in order for achieving the effectively raised performance of heat-dissipation.

It is another object of the present invention to provide a heat-dissipating device used with a cross-flow type fan for generating an approximately parallel cooling airflow with respect to fins in such a way that the probability of the collision between the cooling airflow and the fins may be effectively reduced so as to lower the working noise.

It is still another object of the present invention to provide a heat-dissipating device used for achieving the best performance of heat-dissipation by means of at least one heat-conductive pipe contacting with the center of a heat-conductive base plate, and facilitating the removal of the high working temperature at the center of the heat-conductive base plate.

For the purpose of achieving aforementioned objects, therefore, the main structure according to one preferred embodiment of the present invention comprises a radiator provided with a plurality of fins on a heat-conductive base plate, an air-outlet gap being naturally presented between any two of the adjacent fins, and an accommodating opening being disposed at an identical location on each of the fins; and a cross-flow type fan having a plurality of fan blades provided at a shaft plate, each of the fan blades being presented within the accommodating openings of the fins, in such a way that the airflow generated by the rotation of the cross-flow type fan is allowed for contacting with the fins and discharged through the air-outlet gaps.

DETAILED DESCRIPTION

The structural features and the effects to be achieved may further be understood and appreciated by reference to the presently preferred embodiments together with the detailed description.

Figure 3:
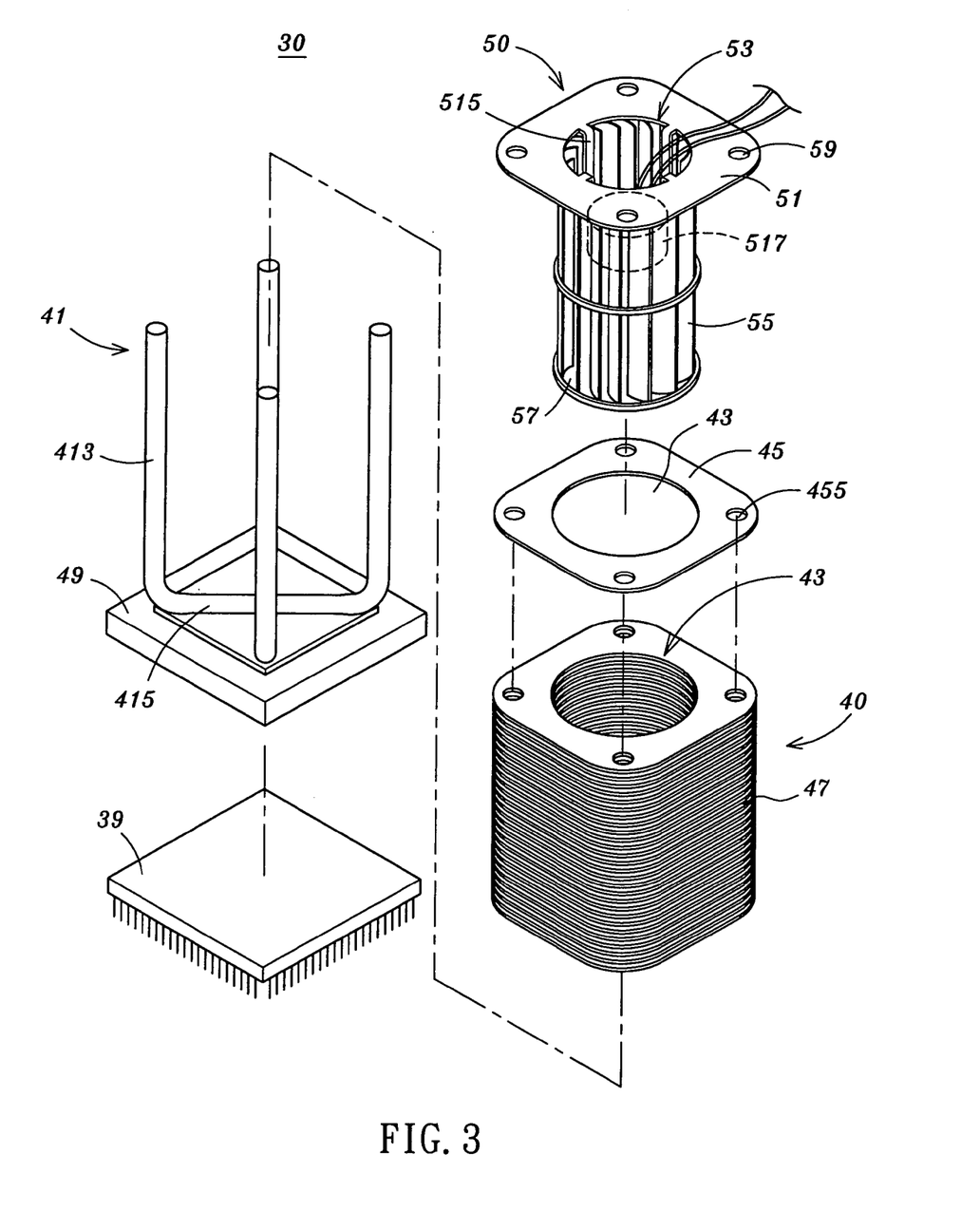
FIG. 3 is a structural disassembled diagram of a heat-dissipating device according to one preferred embodiment of the present invention.

Referring to FIG. 3, firstly, there is shown a structural disassembled diagram of a heat-dissipating device according to one preferred embodiment of the present invention. As shown in this figure, a heat-dissipating device 30 of the present invention mainly comprises a radiator 40 and a cross-flow type fan (centrifugal fan) 50. In this case, the radiator 40 is provided with at least one heat-conductive pipe 41, for example, a U-shaped heat-conductive pipe in this embodiment, may be attached to a heat-conductive base plate 49. A bottom pipe 415 of this heat-conductive pipe is horizontally disposed at the center of the heat-conductive base plate 49 in a staggered manner, and whereby, the high working temperature of the heat-conductive base plate 49 attached to the surface of various electronic devices 39, such as central processing units, chips, etc., as examples, may be removed. Besides, two sides of the bottom pipe 415 are projectingly provided with upright pipes 413, respectively. Further, at least one through-hole 455 is chiseled through each of the fins 40, and then passed through by the upright pipe 413, correspondingly. In this manner, a plurality of fins 45 may be fixedly stacked on and contacted with the heat-conductive pipe 41, while between any two of the adjacent fins 45, an air-outlet gap 47 may be formed naturally. An accommodating opening 43 may be chiseled at an identical location of each fin 45.

Moreover, the cross-flow type fan 50 is provided with a plurality of parallel fan blades 55 at the bottom side of a shaft plate 51, and a diversion hole 57 is then naturally formed between any two of the adjacent fan blades 55. Further, the same as the fins 45, a top air inlet 53 and at least one second through-hole 59 to be passed through by the upright pipe 413 may be chiseled in place through the shaft plate 51. Besides, at a part of the top air inlet 53, a supporting stand 515 connected to the shaft plate 51 is provided for fastening a motor 517.

Figure 4:
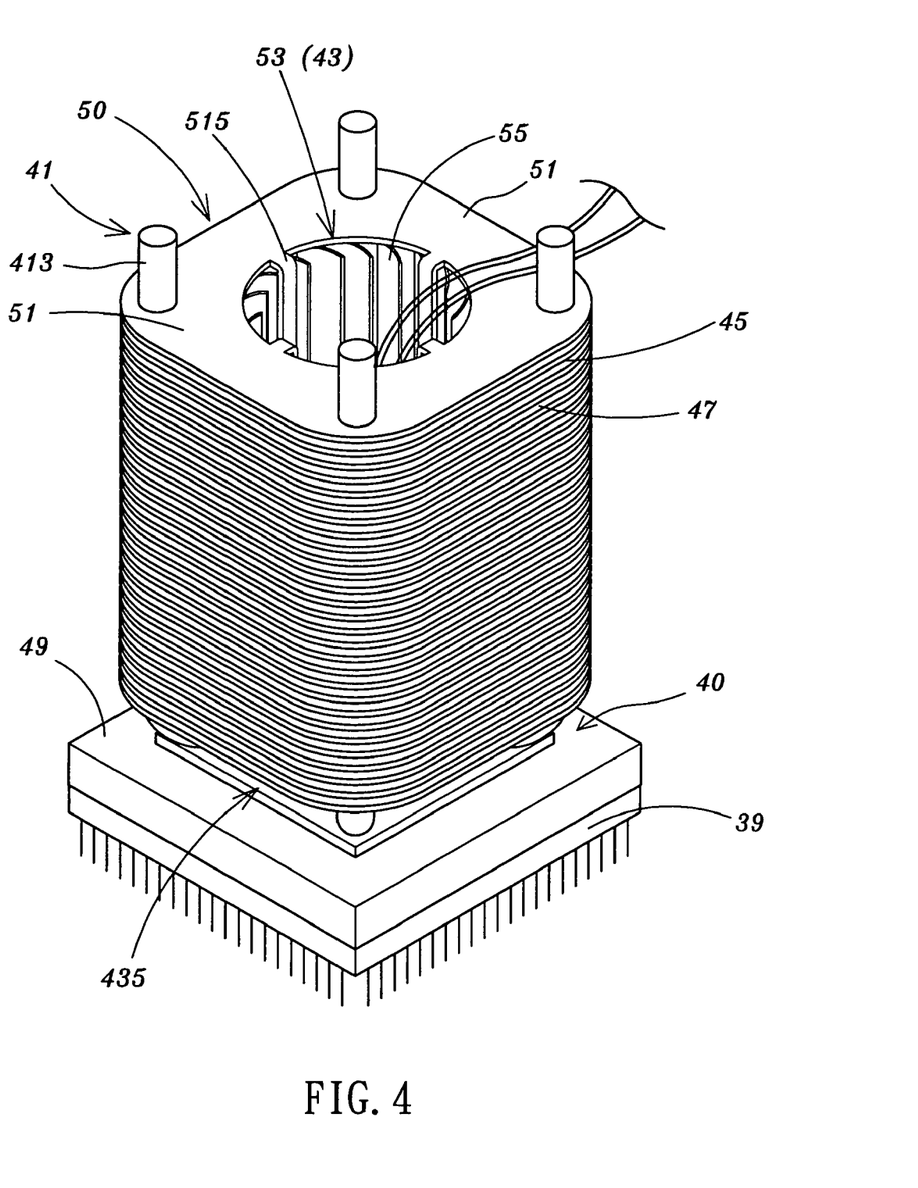
FIG. 4 is a perspective diagram showing the present invention after assembled.

Additionally, referring to FIG. 4, there is shown a perspective diagram of the present invention after assembled. As shown in this figure, when assembling the device of the present invention, the heat-conductive base plate 49 of the radiator 40 is fixedly provided on the top surface of the electronic device 39, while each of the fins 45 is passed through at the first through-hole (455) thereof by the upright pipes 413 of the heat-conductive pipe 41, such that each of them may be stacked at different locations on the upright pipe 413, and presented as a parallel mode with respect to the heat-conductive base plate 49. Further, the cross-flow type fan 50 may be fixed at the top side of the fins 45 by means of the upright pipe 413 passing through the second through-hole (59) of the shaft plate 51, while the fan blades 55 and the motor (517) of this fan may be naturally accommodated within the accommodating opening 43 of the fins 45.

In this embodiment, owing to the fixedly provided on the heat-conductive pipe 41, the fins 45 may be not contacted with the heat-conductive base plate 49 directly, which enables a bottom air inlet 435, presented between the fins 45 and the heat-conductive base plate 49, introducing the air into the operation area of the cross type fan 50 from outside. In this way, the cross-flow type fan 50 are thus provided with both of the top air inlet 53 and the bottom air inlet 435 for facilitating the raised efficiency of heat-dissipation.

Figure 5:
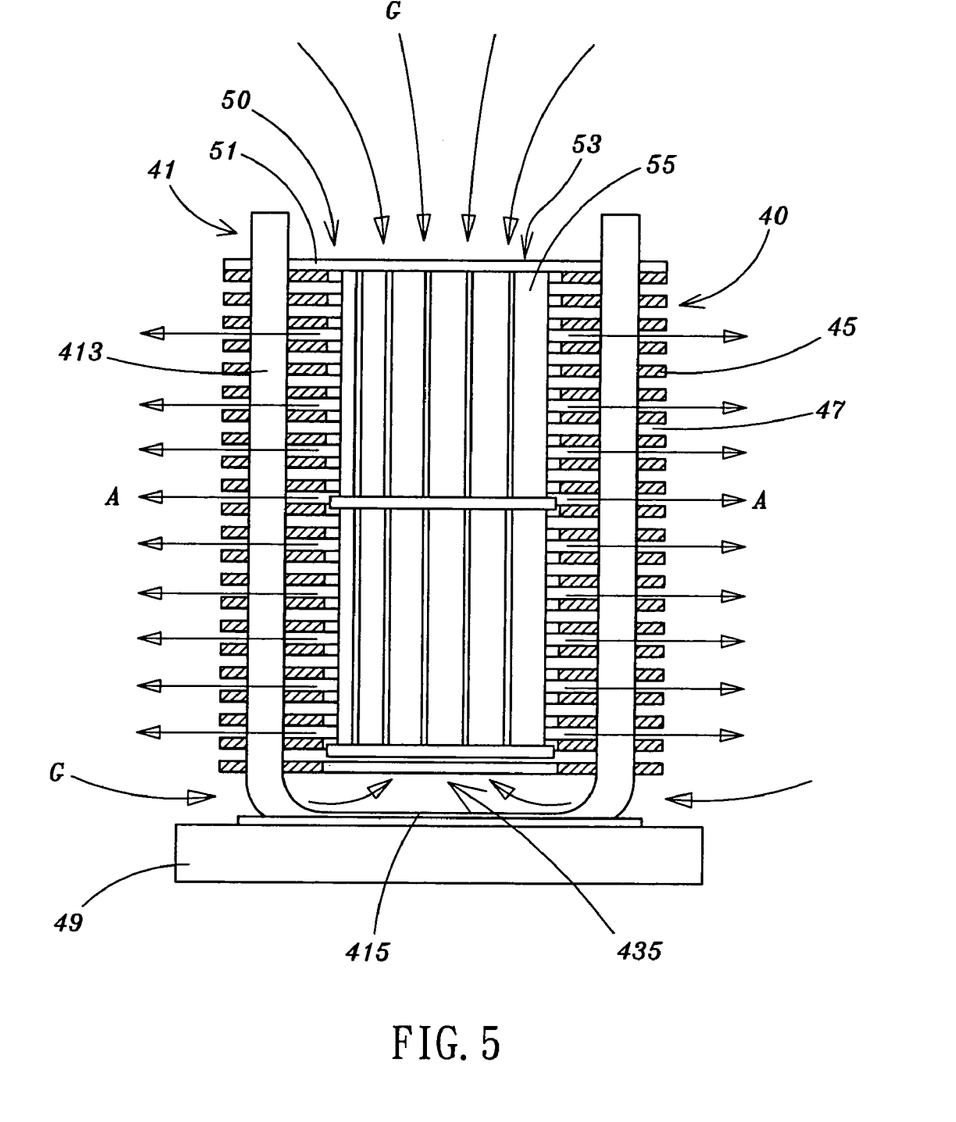
FIG. 5 is a diagram of an airflow path showing the present invention when the fan rotates.

Moreover, referring to FIG. 5, there is shown a diagram of an airflow path according to the present invention when the cross-flow type fan rotates. In the present invention, as shown in this figure, when the fan blades 55 of the cross-flow type fan 50 rotates, the gas G will be introduced into the operation area of the cross-flow type fan 50 from outside through the top air inlet 53 or bottom air inlet 55. Further, on operation of the fan blades, the cooling airflow A may blow toward the fins 45 in an approximately parallel manner with respect to the fins 45, and be discharged outside through the air-outlet gap 47 of these fins.

In this present invention, the cooling air A may be uniformly distributed over each fin 45, without the general problem in relation to the distance spaced from the fan in the conventional heat-dissipating device, due to the fact that the fan blades 55 of the cross-flow type fan 50 is positioned as a whole within the accommodating opening 43 constituted by each fin 45. Thus, the efficiency of heat-dissipation is effectively raised.

Furthermore, the probability of collision between the cooling airflow A and the fins 45 may be effectively reduced, due to the fact that the cooling airflow A, generated by the rotation of the fan blades, is contacted with each of the fins 45 in an approximately parallel manner. Thereby, not only the greatest efficiency of heat-dissipation, but also the reduced annoying working noise may be achieved.

Further, the high working temperature at the center of the heat-conductive base plate 49 is opportunely removed by the upright pipes 413 or individual fins 45 for facilitating the greatest efficiency of heat-dissipation, because the bottom pipe 415 of the heat-conductive pipe 41 may pass through the center of the heat-conductive base plate 49 in a staggered or horizontal manner.

Figure 6:
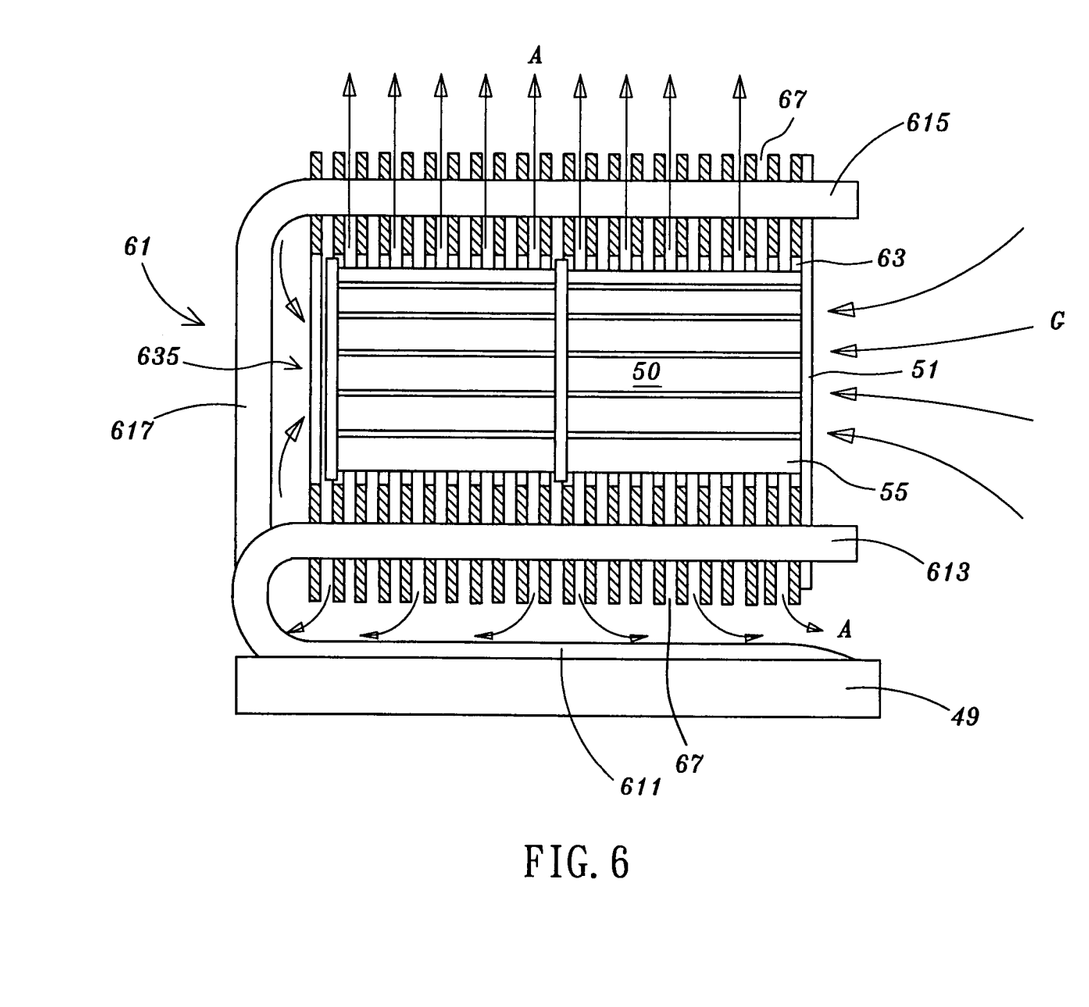
FIG. 6 is a structural cross section view of a heat-dissipating device according to another embodiment of the present invention.

Finally, referring to FIG. 6, there is shown a structural cross section view of the heat-dissipating device according to one embodiment of the present invention. As illustrated in this figure, a heat-dissipating device 60 of this embodiment mainly comprises a plurality of fins 65 fixedly provided on the heat-conductive base plate 49 directly or indirectly, and presented as a vertical angle or an inclined angle with respect to the heat-conductive base plate 49. Again, an air-outlet gap 67 is naturally formed between any two of the adjacent fins 65, and an accommodating opening 63 allowed for accommodating the cross-flow type fan 50 is chiseled at an identical location of each fin 65.

Furthermore, a bottom strut 611, disposed at the bottom side, of the heat-conductive pipe 61 may contact with or directly pass through one side of each fin 65. For the purpose of raising the effect of heat-dissipation of individual fins 65 and facilitating the fixing the fixing of the cross-flow type fan 50, at least one strut may be horizontally provided on a connecting pipe 617 of the conductive pipe 61. In this embodiment, for example, this at least one strut is illustrated as an E-shaped structure, in which, except for the bottom strut 611, there are further provided with a central strut 613 and a top strut 615 near the center and the top side, respectively, equally allowed for passing through the first through-hole (455) at each of the fins 65 and the second through-hole (59) at the shaft plate 51.

As the fan blade 55 rotates, the cooling air G may be equally introduced from outside via two sides of the cross type fan 50, the accommodating opening (first air inlet) 63, and a second air inlet 635, as well as transformed into the cooling airflow A approximately parallel with the fines 45 in an axial-in horizontal-out manner, and then discharged through the air-outlet gap 67. Again, the effectively raised efficiency of heat-dissipation and the reduced working noise may be thus equally achieved.

To sum up, the present invention is related to a heat-dissipating device, particularly to a heat-dissipating device capable of cooperating with a cross-flow type fan, which not only the significantly raised effect of heat-dissipation of a heat-conductive base plate, but also the effectively reduced working noise due to a parallel path of the airflow with respect to fins may be obtained.

The foregoing description is merely one embodiment of present invention and not considered as restrictive. All equivalent variations and modifications in process, method, feature, and spirit in accordance with the appended claims may be made without in any way from the scope of the invention.

LIST OF REFERENCE SYMBOLS

- 10 heat-dissipating device
- 11 axial-flow type fan
- 113 air outlet
- 115 fan blade
- 117 motor
- 15 radiator
- 151 heat-conductive base plate
- 153 air outlet
- 155 fin
- 19 electronic device
- 30 heat-dissipating device
- 39 electronic device
- 40 radiator
- 41 heat-conductive pipe
- 413 upright pipe
- 415 bottom pipe
- 43 accommodating opening
- 435 bottom air inlet
- 45 fin
- 455 first through-hole
- 47 air-outlet gap
- 49 heat-conductive base plate
- 50 cross-flow type fan
- 51 shaft plate
- 515 supporting stand
- 517 motor
- 53 top air inlet
- 55 fan blade
- 57 diversion hole
- 59 second through-hole
- 60 heat-dissipating device
- 61 heat-conductive pipe
- 611 bottom strut
- 613 central strut
- 615 top strut
- 617 connecting pipe
- 63 accommodating opening
- 635 second air inlet
- 65 fin
- 67 air-outlet gap

What is claimed is:

1. A heat-dissipating device, comprising:
   a radiator provided with a plurality of longitudinally stacked fins on a heat-conductive base plate, an air-outlet gap being disposed between any adjacent two of said fins, and an accommodating opening disposed at an identical location on each of said fins defining a longitudinally extended cavity within said radiator; and
   a cross-flow type fan having a plurality of fan blades provided at a shaft plate, said plurality of fan blades being disposed within said cavity of said radiator, said cross-flow type fan generating an airflow by the rotation of said plurality of fan blades where ambient air is drawn longitudinally into said cavity and transversely discharged radially through said air-outlet gaps to contact said fins.

2. The heat-dissipating device according to claim 1, further comprising at least one heat-conductive pipe, each contacting with said heat-conductive base plate.

3. The heat-dissipating device according to claim 1, further comprising at least one heat-conductive pipe, each contacting with said heat-dissipating fins.

4. The heat-dissipating device according to claim 1, further comprising at least one heat-conductive pipe, said heat-conductive pipe including a bottom pipe, and at least one upright pipe projectingly provided at said bottom pipe, wherein said bottom pipe is fixedly contacted with said heat-conductive base plate, while said upright pipe is contacted with said fins.

5. The heat-dissipating device according to claim 4, wherein each of said fins is formed with at least one first through-hole passed through by said upright pipe, and each of said fins is contacted with and fixed at different locations, respectively, of said heat-conductive pipe.

6. The heat-dissipating device according to claim 4, wherein said heat-conductive pipe is presented as a U-shaped structure.

7. The heat-dissipating device according to claim 2, wherein said shaft plate of said cross-flow type fan is provided with at least one second through-hole thereon to be passed through by said heat-conductive pipe, in such a way that said cross-flow type fan is fixedly provided within said accommodating opening.

8. The heat-dissipating device according to claim 1, further comprising a bottom air inlet disposed between said heat-conductive base plate and said plurality of longitudinally stacked fins.

9. The heat-dissipating device according to claim 1, wherein said fins are disposed in parallel relationship with respect to said heat-conductive base plate.

10. The heat-dissipating device according to claim 1, wherein said fins are projectingly provided on said heat-conductive base plate directly, and presented in an orientation selected from the group consisting of a vertical angle, an inclined angle with respect to said heat-conductive base plate, and a combination thereof.

11. A heat-dissipating device, comprising:
a radiator provided with a plurality of fins on a heat-conductive base plate, an air-outlet gap disposed between any two adjacent fins of said plurality of fins, and an accommodating opening disposed at an identical location on each of said fins; and
a cross-flow type fan having a plurality of fan blades provided at a shaft plate, said plurality of fan blades being disposed within said accommodating openings of said fins, such that an airflow generated by rotation of said cross-flow type fan contacts said fins and is discharged through said air-outlet gaps, a bottom side of said shaft plate of said cross-flow type fan being provided with at least one supporting stand extending therefrom for fastening a motor thereto, a side of said supporting stand being formed with a top air inlet.

12. A heat-dissipating device, comprising:
a radiator projectingly provided with a plurality of longitudinally stacked fins directly on a heat-conductive base plate, an air-outlet being disposed between any adjacent two of said fins, and an accommodating opening being disposed at an identical location on each of said fins defining a longitudinally extended cavity within said radiator; and
a cross-flow type fan having a plurality of fan blades provided at a shaft plate, said plurality of fan blades being disposed within said cavity of said radiator, said cavity having an air inlet at each of opposing longitudinal ends thereof, said cross-flow type fan generating airflow by the rotation of said plurality of fan blades where ambient air is drawn longitudinally into said cavity through said air inlets and transversely discharged radially through said air-outlet gaps to contact said fins.

13. The heat-dissipating device according to claim 12, further comprising at least one heat-conductive pipe, a portion of said heat-conductive pipe being contacted with said heat-conductive base plate, and another portion thereof being contacted with said fins.

14. The heat-dissipating device according to claim 13, wherein said heat-conductive pipe is presented as an E-shaped structure, a bottom-side strut thereof located at a bottom portion being contacted with said heat-conductive base plate, while a central strut thereof being located at a center and a top-side strut being located at a top portion passing through said fins.

15. The heat-dissipating device according to claim 13, wherein said shaft plate of said cross-flow type fan is provided with at least one second through-hole thereon to be passed through by said heat-conductive pipe, in such a way that said cross-flow type fan is fixedly provided within said cavity.

16. The heat-dissipating device according to claim 12, wherein said fins are disposed in an orientation selected from the group consisting of a vertical angle, an inclined angle with respect to said heat-conductive base plate, and a combination thereof.

* * * * *